US005483174A

United States Patent [19]
Hembree et al.

[11] Patent Number: 5,483,174
[45] Date of Patent: * Jan. 9, 1996

[54] TEMPORARY CONNECTION OF SEMICONDUCTOR DIE USING OPTICAL ALIGNMENT TECHNIQUES

[75] Inventors: David R. Hembree, Boise; Warren M. Farnworth, Nampa, both of Id.

[73] Assignee: Micron Technology, Inc., Boise, Id.

[*] Notice: The portion of the term of this patent subsequent to Jun. 13, 2012, has been disclaimed.

[21] Appl. No.: 192,391

[22] Filed: Feb. 3, 1994

Related U.S. Application Data

[63] Continuation of Ser. No. 896,297, Jun. 10, 1992, Pat. No. 5,424,652.

[51] Int. Cl.[6] ............................................. G01R 31/28
[52] U.S. Cl. ............................................ 324/765; 324/755
[58] Field of Search ........................... 324/158 R, 158 F, 324/158 D, 758, 757, 765, 755, 72.5, 158.1; 437/8; 257/10; 439/61, 91, 482, 67; 29/580

[56] References Cited

U.S. PATENT DOCUMENTS

| | | | |
|---|---|---|---|
| 3,583,561 | 6/1968 | Wiesler | 324/158 |
| 3,997,963 | 12/1976 | Riseman | 29/580 |
| 4,554,505 | 11/1985 | Zachry | 324/158 F |
| 4,766,371 | 8/1988 | Moriya | 324/158 F |
| 4,968,931 | 11/1990 | Littlebury et al. | 324/158 F |
| 5,123,850 | 6/1992 | Elder et al. | 439/67 |
| 5,140,405 | 8/1992 | King et al. | 357/67 |
| 5,213,676 | 5/1993 | Reele et al. | 205/118 |
| 5,225,037 | 7/1993 | Elder et al. | 324/754 |

*Primary Examiner*—Vinh P. Nguyen
*Attorney, Agent, or Firm*—Stanley Protigal; Stephen A. Gratton

[57] ABSTRACT

Optical alignment techniques, such as those used in "flip chip" bonding, are used to establish ohmic contact with the die by means of raised portions on contact members. This permits accurate alignment with a temporary die fixture in order to test the die. The tested die can then be qualified under a known good die program as having an acceptable degree of reliability. This permits the die to be characterized prior to assembly, so that the die may then be transferred in an unpackaged form. The ohmic contact is preferably established by applying a compression force applied to the die against the substrate results in a limited penetration of the contact member into the bondpads. The arrangement may be used for establishing electrical contact and with a burn-in oven and with a discrete die tester.

22 Claims, 5 Drawing Sheets

TEMPORARY CONNECTION OF SEMICONDUCTOR DIE USING OPTICAL ALIGNMENT TECHNIQUES

CROSS-REFERENCE TO RELATED APPLICATIONS

This is a continuation to U.S. patent application Ser. No. 7/896,297, filed Jun. 10, 1992, now U.S. Pat. No. 5,424,652.

FIELD OF THE INVENTION

This invention relates to the field of semiconductor device testing. More specifically, a method and apparatus for testing an unpackaged semiconductor die is described.

BACKGROUND OF THE INVENTION

Many types of semiconductor devices are made using similar manufacturing procedures. A starting substrate, usually a thin wafer of silicon, is doped, masked, and etched through several process steps, the steps depending on the type of devices being manufactured. This process yields a number of die on each wafer produced. Each die on the wafer is given a brief test for full functionality, and the nonfunctional die are mechanically marked or mapped in software. This brief test is only a gross measure of functionality, and does not insure that a die is completely functional or has specifications that would warrant its assembly in a package.

If the wafer has a yield of grossly functional die which indicates that a good quantity of die from the wafer are likely to be fully operative, the die are separated with a die saw, and the nonfunctional die are scrapped while the rest are individually encapsulated in plastic packages or mounted in ceramic packages with one die in each package. After the die are packaged they are rigorously electrically tested. Components which turn out to be nonfunctional or which operate at questionable specifications are scrapped or devoted to special uses.

Packaging unusable die only to scrap them after testing is a waste of time and materials, and is therefore costly. Given the relatively low profit margins of commodity semiconductor components such as dynamic random access memories (DRAMs) and static random access memories (SRAMs), this practice is uneconomical. However, no thorough and cost effective method of testing an unpackaged die is available which would prevent this unnecessary packaging of nonfunctional and marginally functional die.

It is proposed that multiple integrated circuit devices be packaged as a single unit, known as a multi chip module (MCM). This can be accomplished with or without conventional lead frames. This creates two problems compared to conventional test methods. Firstly, discrete testing is more difficult because the conventional lead frame package is not used. Furthermore, when multiple devices are assembled into a single package, the performance of the package is reduced to that of the die with the lowest performance. In other words, the ability to presort the individual dice is limited to that obtained through probe testing. Secondly, the packaging may have other limitations which are aggravated by burn-in stress conditions so that the packaging becomes a limitation for burn-in testing.

The practice of packaging die only to find the component must be scrapped can especially adversely affect yields on multi-chip modules (MCMs). With MCMs, several unpackaged die are assembled into a single component, then the component is tested as a single functional unit. If a single die is nonfunctional or operates outside of acceptable specifications, the entire component fails and all die in the package are scrapped or an attempt is made to "re-work" the MCM. There is presently no cost-effective way to reclaim the functioning die. Statistically, the yields of MCMs decrease in proportion to the increasing number of die in each module. The highest density modules have the lowest yields due to their increased total silicon surface area. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Where packaging costs are considerably higher, however, as in ceramic packaged parts, testing a die before packaging is economical when the cost of packaging divided by the package yield is equal to or greater than the cost of testing:

$$C_{DIE} \times (C_{PACKAGE}/Package\ Yield) = C_{DIE} \times C_{ADDL.\ KGD}$$

where $C$=cost $C_{DIE}$=manufacturing cost of functional die $C_{ADDL.\ KGD}$=additional cost of testing unpackaged die in order to produce known good die (KGD)

Note that in the case of discretely packaged parts, the cost of the die ($C_{DIE}$) is essentially not a factor since it is the same on both sides of the equation. This changes in the case of MCMs having more than one part type, for example memory and a microprocessor. Scrapping (or reclaiming) the microprocessor after packaging because of malfunctioning memory is much more costly than scrapping a module containing only memory:

$$(C_{DIE}) \times (Number\ of\ Die/Die\ Yield) \times C_{PACKAGE} = C_{DIE} \times C_{ADDL.\ KGD}$$

The above equation must be modified to account for varied costs and yields of die in modules with mixed part types. With MCMs, the cost of packaging a failed part is proportional to the number of die in the module. In the case of a memory module having 16 die, where probe-to-ship yield of the die is 95%, the costs are:

$$16/0.95 \times C_{PACKAGE} = C_{ADDL.\ KGD}$$

so the additional costs of testing for known good die (KGD) may be 16 times the cost of testing an unrepairable module and still be economical. This, of course, is modified by the ability to repair failed modules.

Testing of unpackaged die before packaging would be desirable as it would result in reduced material waste, increased profits, and increased throughput. Using only known good die in multichip modules would increase yields significantly.

SUMMARY OF THE INVENTION

An object of the invention is to provide a means for testing and burning in a semiconductor die before it is packaged.

This and other objects of the invention were realized by temporarily placing a die in a ceramic package, then testing the assembled package. To temporarily package the die, a ceramic housing was manufactured having input/output leads electrically coupled with contacts on the interior of the package. In one embodiment, gold alloy was chosen as a material from which to manufacture the bumps because of its soft, conductive properties, but other workable materials are possible.

The back (noncircuit) side of a discrete semiconductor die was mounted to a lid, and bond pads on the die were aligned with the contacts on the interior of the package. The bond pads were then contacted with the contacts to form a temporary electrical contact therebetween. Since the semiconductor package had the form of a conventional package, conventional functional and parametric testing means was possible and completed. After testing the package, the lid was removed from the ceramic package body, and the gold bumps yielded without resulting damage to the die bond pads. The known good die is then available for packaging in a multichip module, for assembly in a conventional package, or for use in other systems using unpackaged die.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
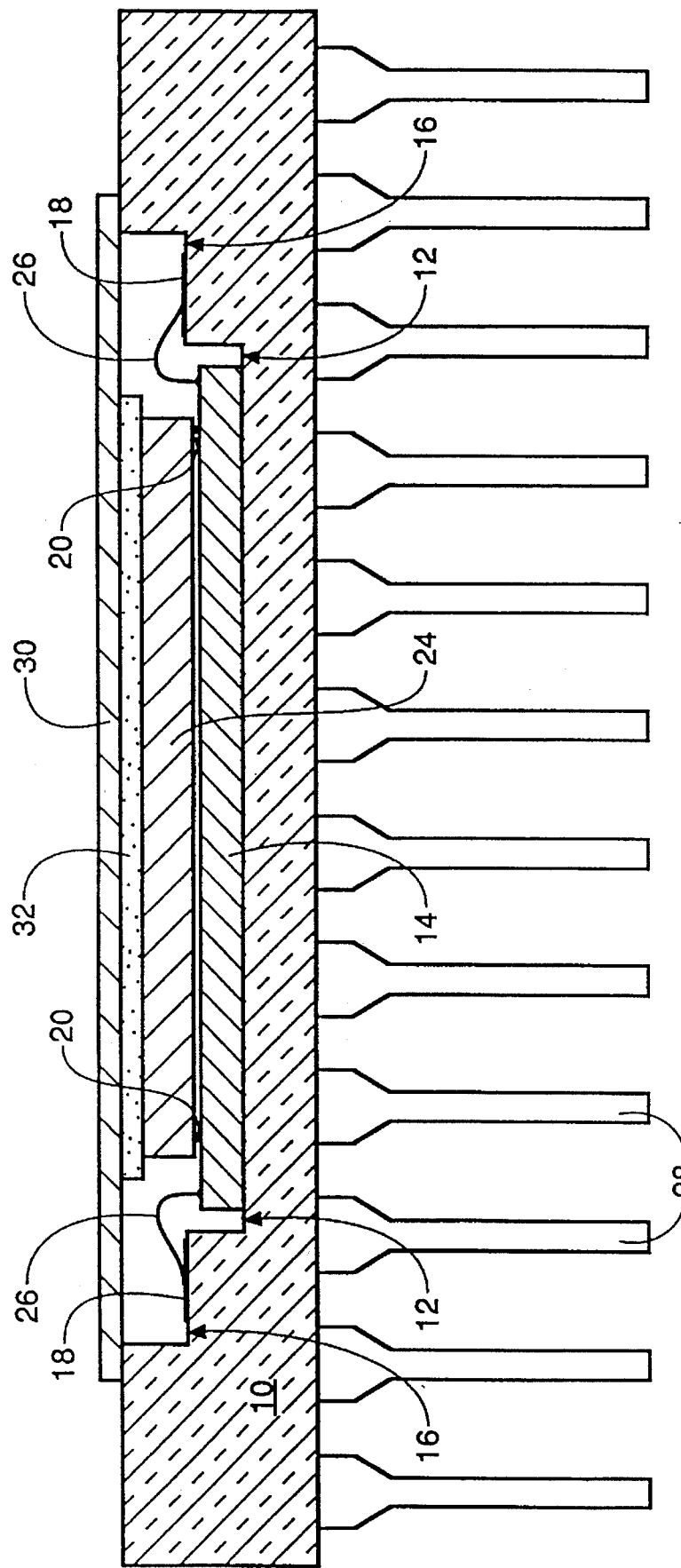
FIG. 1 is a cross section of a first embodiment of the invention having a die mounted to a lid.
Figure 2:
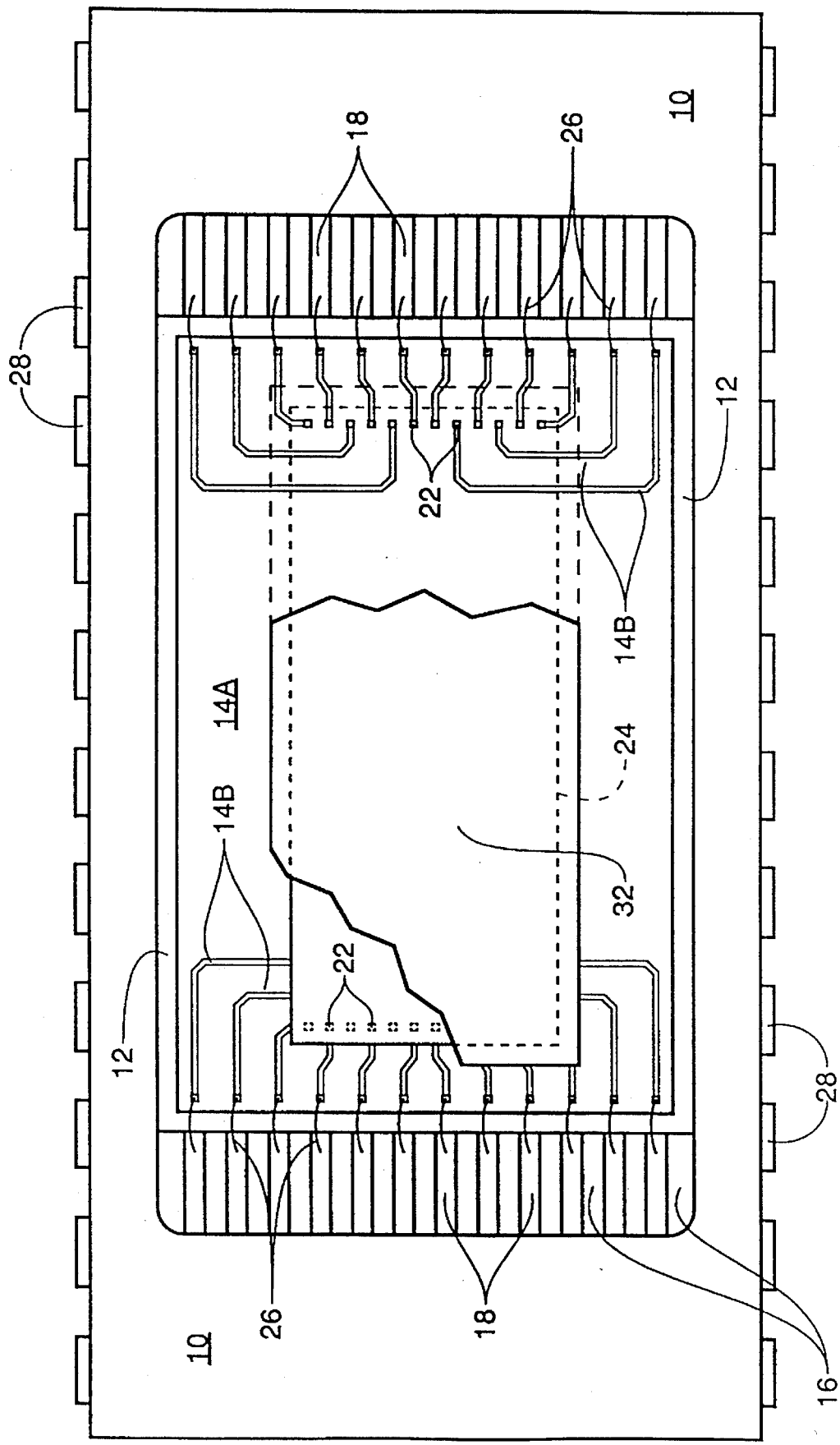
FIG. 2 is a top view of the FIG. 1 embodiment.

FIG. 1 is a cross section, and FIG. 2 is a top view, describing an embodiment of the present invention. A housing 10 was manufactured from ceramic having a bottom shelf 12 for receiving a substrate insert 14 and a pair of "bond" shelves 16. Upon the bond shelves 16 were housing connection points 18 coupled with traces (not shown), the traces running through the housing 10 and terminating externally to the housing 10. In the instant case the traces manufactured within the housing comprised a gold alloy and the housing 10 was manufactured using standard technology used in the art of ceramic packaging of semiconductor die. Other materials may function adequately for the housing 10 and the traces.

The bottom shelf 12 of the housing 10 received the insert interconnect substrate 14, the insert 14 being permanently attached to the bottom shelf 14 of the housing 10. This attachment is preferably accomplished with a room temperature vulcanizing silicone rubber (RTV, not shown) or with an adhesive epoxy, although other attachment technology or materials can be used. The insert 14 comprised a nonconductive support structure 14A, in the instant case manufactured from ceramic, having electrically conductive gold interconnection circuitry 14B, although other conductive materials may be used. Precision contacts 20, manufactured in the instant case from an alloy of gold, platinum, and palladium allowed for coupling with the bond pads 22 on the semiconductor die 24 to be tested. The contacts 20 were approximately 0.001" in diameter, and extended 0.001" to 0.002" high above the insert trace circuitry 14B. The contacts 20 were all coplanar to within 10% across the contact pattern. An insert 14 thickness of approximately 0.015" was sufficient, with outside dimensions being slightly smaller than the cavity in the bottom of the housing 10. The contacts 20 mirrored the bond pads 22 on the die 24, and were spaced so as to contact the bond pads 22 on the semiconductor die 24 directly. The contacts 20 were coupled with the insert substrate electrical traces 14B, the insert traces 14B running from the contacts 20 to the edge of the insert substrate 14A. The insert traces 14B terminated near the edge of the insert substrate 14A.

In this embodiment, the interconnect insert 14 is a separate component which is bonded to the bottom shelf 12 of the housing 10. It is also possible to construct the invention with an interconnect structure incorporated into the housing 10, rather than as a separate component.

The insert traces 14B which terminated near the edge of the insert substrate 14A were wire bonded 26 to the connection points 18 within the housing 10, and were therefore electrically coupled with leads 28 attached to the traces (not shown) on the exterior of the housing 10. The leads 28 were coupled to the package using side brazing, but other coupling means may be available. The leads 28 allow for coupling of the package with a test fixture.

A package lid structure 30 was used upon which was mounted the semiconductor die 24. The back (noncircuit) side of the die 24 was attached to the lid 30 with a flat, soft sheet of a flexible adhesive polymer material 32 that performed as both an adhesive tape and a force loading material, although the use of such an adhesive material may not be necessary. A semi-cured silicone material was used, and in the instant case was silicone elastomer, from Gel Pak Corporation of Stanford, Calif. The polymer allowed for the removal of the die 24 when desired, but provided a sufficiently firm attachment to keep the die from shifting once it was attached. The adhesive properties of the polymer, therefore, were relatively strong in shear but relatively weak in tension and allowed for separation from the die with no residual adhesive material left on the back of the die. This property also allowed the polymer sheet to be removed from the lid and replaced, since the material may cure and lose its adhesive properties over time, or with elevated temperatures which may be present during the testing phase of the assembled package. Curing of the silicone material to a point that it is no longer sufficiently flexible and soft can cause problems with cushioning the semiconductor die and force loading of the insert substrate contacts.

The lid 30 was a commercially available, low cost metal item. A lid approximately 0.01" in thickness was found to be sufficient, although any reasonable lid thickness would function sufficiently, and in the embodiment, the lid was a 0.045" thick austenitic stainless steel. Other materials may function adequately.

Once the die 24 was attached to the lid 30, the lid 30 was positioned over the insert 14. The bond pads 22 on the die 24 were aligned with the insert contacts 20 on the insert 14. In the instant case, an alignment system, available from Research Devices of Piscataway, N.J., was used to vertically align the bond pads 22 on the die 24 with the contacts 20 on the insert 14. The alignment system is usually used for flip chip die attachment, but functions sufficiently in the inventive capacity. After vertical alignment, the alignment system lowered the lid assembly to contact the bond pads 22 on the die 24 with the contacts 20 on the insert 14. The "bumps" that made up the contacts 20 contacted the metal bond pads 22 of the die 24 sufficiently to ensure a good electrical contact. Sufficient contact force must be maintained to insure good electrical contact between the insert contacts 20 and the die bond pads 22. Excessive contact force, however, will cause damage to the die bond pads 22 (usually manufactured from aluminum) and underlying die circuitry. The contact force must be sufficient to push the insert substrate contacts 20 through the layer of aluminum oxide (not shown) which typically forms on the aluminum bond pads 22. Penetration of the aluminum oxide layer is necessary for good electrical contact, since aluminum oxide is a poor electrical conductor. A force of about 80 grams per contact was found to be sufficient for contacts and bond pads as described above.

After mating the bond pads 22 with the contacts 20, metal clips (not shown) held the lid 30 in place to prevent shifting of the lid 30, and therefore the die 24, during testing. Removably "tacking" the lid 30 to the housing 10, for example with solder or epoxy, may also be sufficient as long as the lid 30 can be removed from the housing 10 without damage to the lid 30 or housing 10.

Since the assembled package was similar to a conventional ceramic semiconductor package, a conventional test sequence, including burning in, was used to ensure functionality of the die. After the die was tested, the lid was removed from the package by removing the clips, and the die was removed from the lid. Nonfunctional die can be discarded while the known good die can be packaged or shipped directly to customers. In any case, packaging only known good die increases the yield of packaged devices. As long as the die is not damaged before packaging, any malfunctions of the packaged die results from an improperly packaged device. Poor wire bonds, cracked packages, and improper die attachments are the most likely causes of device malfunctions using such die.

It was found that the test package 10, 14, lid 30, and polymer 32 could be used to test a plurality of semiconductor die 24. The substrate contacts 20 flattened out slightly during the first use, but it was found that if the pressure between the lid assembly and the housing 10 are controlled, an adequate electrical contact would be maintained during subsequent die testing.

Figure 3:
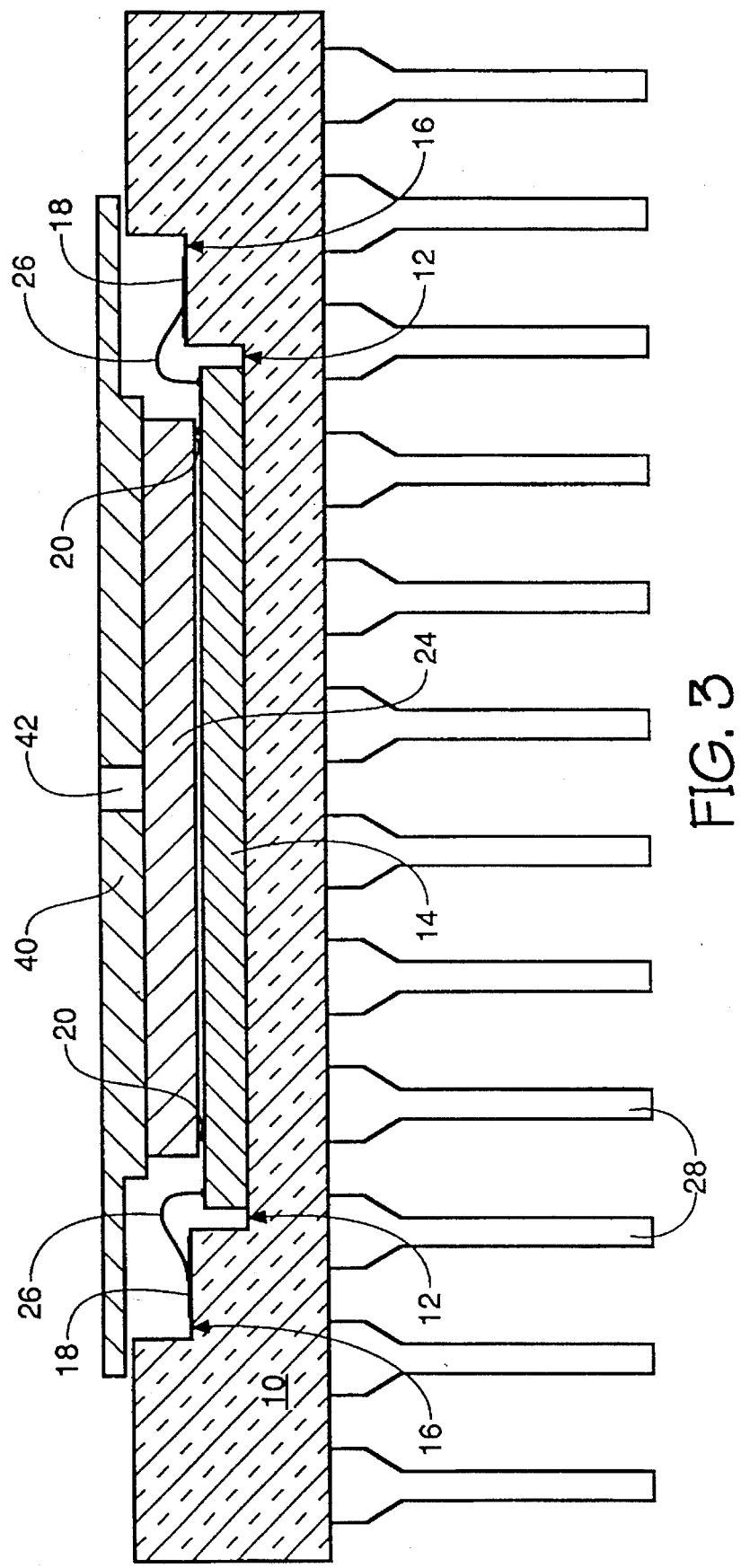
FIG. 3 is a cross section of a second embodiment of the invention in which a vacuum is used to secure a die to the lid during placement into a carrier.

As shown in FIG. 3 embodiment, a lid 40, for example of a 0.045" thick austenitic stainless steel, had a hole 42 therethrough to aid in securing the die 24 in alignment with the lid 40 during a flip chip process. To attach the die 24 to the lid 40, a vacuum device (not shown) picked up the lid 40 with the vacuum device placed over the hole 42. The vacuum was sufficient to hold the lid 40. The die 24 was then aligned with the lid 40, and the vacuum also picked up the die 24 thereby holding the die 24 in aligned contact with the lid 40. The lid 40 and die 24 were then lowered onto the insert 14, thereby permitting the alignment of the bond pads with the insert contacts 20. This vacuum arrangement was found to preclude the need for the adhesive polymer which was used in the previous embodiment.

Figure 4:
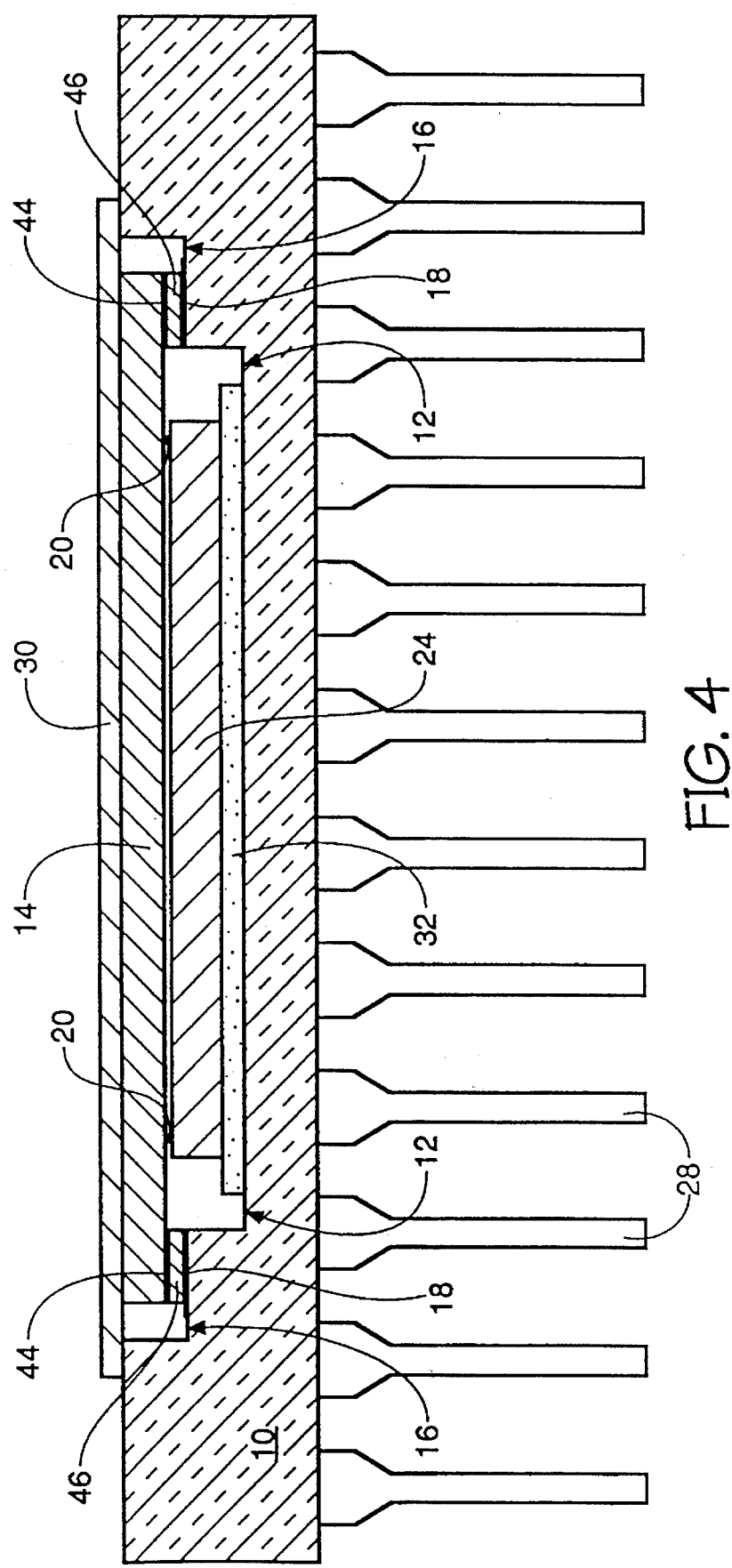
FIG. 4 is a cross section of a third embodiment of the invention having a die mounted to the package housing.

A third embodiment of the invention, described in FIG. 4, may also be used to test a discrete semiconductor die 24. In this embodiment, a housing 10 with traces within as described for a first embodiment was formed. A layer of adhesive polymer 32 was placed on the bottom shelf 12 of the housing 10, and the noncircuit side of a die 24 is attached to the housing 10 with the polymer 32.

Next, a lid 30 was formed and an insert 14 of ceramic or other workable material was permanently attached thereto with epoxy or other material (not shown). The insert 14 had traces and contacts 20 thereon as previously described for the embodiment of FIGS. 1 and 2. To electrically couple the bond pads of the die 24 to the input/output leads 28 that are attached to the traces (not shown) running through the housing 10, the contacts 20 on the insert 14 were aligned with the bond pads of the die 24. The lid 30 was lowered, and the contacts 20 on the insert 14 contacted the bond pads on the die 24, forming an electrical connection therewith. The insert 14 was larger than the insert of the first embodiment, and extended past the edge of the bond shelf 16. The ends of the traces 44 on the insert 14 were aligned with the contact points 18 on the bond shelf 16, and electrical contact was made using a sheet of Z-axis conductive polymer 46, available from A.I. Technology, of Princeton, N.J. Other coupling means are possible, and an alternative is described below. The conductive polymer 46 was interposed between the contact points 18 on the bond shelf 16 and the insert traces 44 which extended to the edge of the insert 14. As long as a minimum force was maintained between the lid 30 and the housing 10, the electrical contact between the insert traces 44 and the contact points 18 was maintained. An electrical pathway extends from the bond pads on the die 24, through the contacts 20 on the insert 14, through the traces 44 on the insert 14, through the Z-axis conductive polymer 46 to the contact points 18 on the bond shelf 16, through the traces (not shown) within the housing 10, and finally to the leads 28 attached thereto.

After assembly, the lid 30 was attached to the housing 30, for example by using clips, by solder tacking the lid 30 to the housing 10, or by other workable means. Any means used, however, must allow for the removal of the lid without damage to either the lid or the housing.

Figure 5:
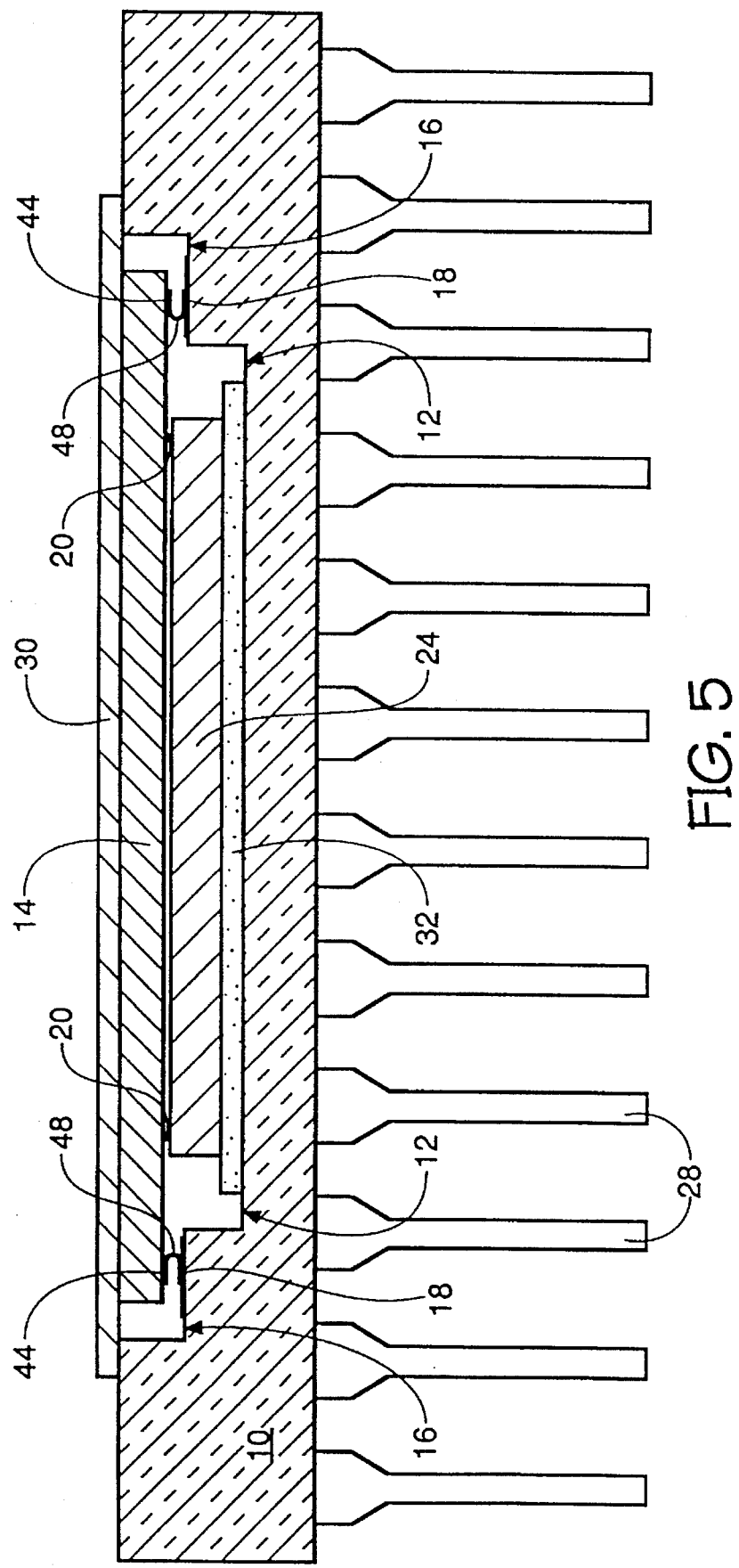
FIG. 5 is a cross section of a fourth embodiment of the invention in which metal contacts couple an interconnect with a lower housing member.

As shown in FIG. 5, a number of folded or curved metal contacts 48 were supported around an elastomer (not shown) and were attached to the contact points 18 on the housing bond shelf 16. The folded contacts 48 made electrical connection with the insert interconnect traces (not shown) when contacts 20 on the insert 14 were brought down into contact with the bond pads on the die 24.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention. For example, contacts can be manufactured from another material other than the gold, palladium, and platinum alloy described, and indeed other means for coupling the bond pads with the traces on the insert may be contemplated.

We claim:

1. A method for testing a semiconductor integrated circuit device in die form, comprising:

a) providing first and second plates;

b) providing a die receiving location on one of the first and second plates;

c) providing a plurality of electrical leads on one of the first and second plates;

d) providing an interconnect, having a plurality of circuit traces formed thereon, the circuit traces connected to contacts adapted to establish electrical communication With contact locations on the die;

e) attaching the die to one of the first and second plates and using flip chip optical alignment to align the contacts on the interconnect with the contact locations on the die to establish said electrical communication between said contacts and said contact locations;

f) establishing electrical communication between the electrical leads and the contacts;

g) performing burn-in and characterization tests on the die while the die is positioned at the die receiving location; and h) separating said die from said interconnect and removing said die from said die receiving location.

2. The method as described in claim 1, and further comprising:

forming each of said contacts with a bump extending sufficiently that it may penetrate its respective contact location on the die, thereby establishing electrical communication with said contact location.

3. The method as described in claim 1, and further comprising:

forming the interconnect of semiconductor material, and forming the circuit traces on the semiconductor material by semiconductor fabrication techniques.

4. The method as described in claim 3, and further comprising:

forming the interconnect of a thickness sufficient to be substantially rigid.

5. The method as described in claim 3, and further comprising:

forming the interconnect as sufficiently thin to be partially flexible.

6. The method as described in claim 3, and wherein:

the interconnect is formed of a structure which includes silicon material, and the circuit traces are formed on the silicon material by semiconductor fabrication techniques.

7. The method as described in claim 1, and further comprising:

forming the interconnect of a ceramic insulator, and forming the circuit traces on a surface thereof.

8. The method as described in claim 1, and further comprising:

positioning the interconnect over the die receiving location so that the contacts on the interconnect face away from the first plate, wherein the die is positioned above the interconnect with the contact locations on the die facing the die receiving location.

9. The method as described in claim 1, and further comprising:

positioning the interconnect over the die receiving location so that the contacts on a face of the interconnect are in a face up position with respect to the die receiving location and positioning the die above the interconnect with the contact locations in a face down position.

10. The method as described in claim 1, and further comprising:

positioning the die over the die receiving location so that the contact locations on the die are in a face up position with respect to the contacts on the interconnect and positioning the interconnect above the die with the plurality of contacts in a face down position on the interconnect at the die receiving location.

11. The method as described in claim 1, and further comprising:

a) providing a pad which is electrically conductive in a Z-axis, normal to a plane of the pad, and which provides electrical isolation across the plane of the pad; and b) positioning the pad between the die and the contact on the interconnect.

12. The method as described in claim 1, and further comprising:

a) providing a resilient pad to bias die received at the interconnect with the contacts after the first and second plates have been mated, to apply sufficient pressure to maintain ohmic contact between said interconnect and said contact locations on the die; and b) said contacts cooperating with said pad to apply sufficient pressure between said pad and said contact locations on the die to establish ohmic contact with said contact locations on the die.

13. The method as described in claim 1, and further comprising:

using an elastomeric strip to further secure the die in a position at the die receiving location by means of electrostatic attraction and frictional forces.

14. The method as described in claim 1, and further comprising:

a) using said first and second plates to bias the die toward the interconnect in order to establish said electrical communication of the contacts with the contact locations on the die;

b) using a clamp to secure the second plate to the first plate, the clamp applying biasing pressure for said biasing of the die toward the interconnect; and c) said contacts cooperating with said first and second plates and said clamp to apply sufficient pressure to establish ohmic contact with said contact locations on the die.

15. The method as described in claim 1, and further comprising:

a) providing one of the first and second plates as a cover plate;

b) said optical alignment being effected by aligning the cover plate with the die receiving location by aligning the die with the interconnect; and c) positioning the interconnect over the die receiving location so that the contacts on an interconnect face are in a face up position with respect to the die receiving location and positioning the die above the interconnect with the contacts locations in a face down position on the die at the die receiving location.

16. The method as described in claim 15, and further comprising:

providing said cover with a hole therein, and said die is secured to said lid by directing a vacuum force through said hole to said lid.

17. The method as described in claim 1, and further comprising:

a) providing one of the first and second plates as a cover plate;

b) said optical alignment being effected by aligning the cover plate with the die receiving location by aligning the die with the interconnect; and c) positioning the die over the die receiving location so that the contact locations on the die are in a face up position with respect to the contacts on the interconnect and positioning the interconnect above the die with the plurality of contacts in a face down position on the interconnect at the die receiving location.

18. The method as described in claim 17, and further comprising:

providing said cover with a hole therein, and said interconnect is secured to said lid with a vacuum force directed through said hole to said lid.

19. A method for testing a semiconductor die comprising:

providing a housing for holding the die and a lid for retaining the die in the housing;

mounting an interconnect to the housing, said interconnect having a raised contact for penetrating a contact location on the die to a predetermined depth;

establishing an electrical pathway between the contact on the interconnect and an external lead on the housing;

attaching the die to the lid using a vacuum directed through an opening in the lid;

aligning the contact on the die with the contact location on the interconnect using a flip chip optical alignment system wherein said contact is aligned with said contact location and lowering the lid and die to contact the contact location to establish an ohmic contact between the contact member on the interconnect and contact location on the die;

testing the die using the housing; and removing the tested die from the housing.

20. The method as recited in claim 19 and further comprising controlling a contact pressure of the die against the interconnect.

21. The method as recited in claim 19 and further comprising forming the housing with a cavity sized for holding the die and the interconnect.

22. The method as recited in claim 19 and further comprising electrically attaching the interconnect to the housing by wire bonding.

* * * * *

UNITED STATES PATENT AND TRADEMARK OFFICE
CERTIFICATE OF CORRECTION

PATENT NO. : 5,483,174
DATED : January 9, 1996
INVENTOR(S) : David R. Hembree, et al It is certified that error appears in the above-indentified patent and that said Letters Patent is hereby corrected as shown below:

On title page, item [75], should read:
Inventors: David R. Hembree, Boise;
Warren M. Farnworth, Nampa;
Alan G. Wood, Boise; all of Idaho Signed and Sealed this Twenty-third Day of April, 1996

Attest:

BRUCE LEHMAN

*Attesting Officer*   *Commissioner of Patents and Trademarks*